United States Patent [19]

Holtzman

[11] 4,065,368

[45] Dec. 27, 1977

[54] PRINTED CIRCUIT COVER COATING COMPRISING AN ULTRAVIOLET RADIATION SENSITIVE ACRYLIC RESIN

[75] Inventor: Kenneth Allan Holtzman, Clifton, N.J.

[73] Assignee: Bell Telephone Laboratories, Incorporated, Murray Hill, N.J.

[21] Appl. No.: 660,473

[22] Filed: Feb. 23, 1976

[51] Int. Cl.² .................... C08F 2/46; C08L 91/00
[52] U.S. Cl. ................. 204/159.23; 204/159.22; 260/22 CB; 22 XA; 427/54
[58] Field of Search ................ 204/159.23, 159.22, 204/159.16; 427/54, 385; 260/22 CB, 22 XA

[56] References Cited

U.S. PATENT DOCUMENTS

| | | | |
|---|---|---|---|
| 2,863,848 | 12/1958 | Robitschek et al. | 260/22 XA X |
| 2,873,210 | 2/1959 | Barrett et al. | 260/22 XA X |
| 3,312,565 | 4/1967 | Rayner et al. | 260/22 XA X |
| 3,380,942 | 4/1968 | Menke | 260/22 XA |
| 3,488,305 | 1/1970 | Siconolfi et al. | 260/22 XA |
| 3,527,722 | 9/1970 | Carlson et al. | 260/22 XA |
| 3,551,235 | 12/1970 | Bassemir et al. | 204/159.23 X |
| 3,616,364 | 10/1971 | D'Alelio | 204/159.14 |
| 3,634,351 | 1/1972 | Kimura et al. | 260/22 CB |
| 3,876,432 | 4/1975 | Carlick et al. | 96/115 P |
| 3,907,732 | 9/1975 | Maruyama et al. | 260/22 XA |

Primary Examiner—Murray Tillman
Assistant Examiner—Thurman K. Page
Attorney, Agent, or Firm—Edward M. Fink

[57] ABSTRACT

A flexible photopolymerizable resin is prepared in a two-stage process by the esterification of castor oil which chlorendic anhydride to yield a chlorendic anhydride half ester and the subsequent reaction of the half ester with a reagent having acrylic functionality, a cure retardant and an acrylic functional monomer. The resultant acrylic ester evidences superior insulation resistance during aging.

8 Claims, No Drawings

PRINTED CIRCUIT COVER COATING COMPRISING AN ULTRAVIOLET RADIATION SENSITIVE ACRYLIC RESIN

This invention relates to protective coatings.

More particularly, the present invention relates to a technique for the preparation of a flexible acrylic resin composition designed for use as an ultraviolet cured cover coat for printed circuits.

During the past decade numerous efforts have been made to develop satisfactory cover coat materials for the myriad of printed circuitry applications. Thus, a wide variety of chemical substances meeting the requirements of specific systems have been developed. These substances differ markedly from the standpoint of flexibility, line spacing, dielectric properties, cure procedures and the like, so precluding the likelihood of any one material meeting the desired criteria.

Among the more promising materials employed heretofore, for this purpose are low molecular weight copolymers of ethyl acrylate and methyl methacrylate containing glycidyl methacrylate, the copolymers being cured photolytically. Studies have revealed that although the insulation resistance of such materials is satisfactory, they are relatively brittle and of limited flame retardancy. Another material employed in such applications which meets flame retardancy requirements comprises a copolymer of a chlorinated acid ester and a tetrafunctional thiol, the product being combined with triallyl phosphate to form the desired compound.

Although the foregoing compositions have been used heretofore, with varying degrees of success, it has often been found that with the passage of time insulation resistance degrades to an unsatisfactory level. Accordingly, workers in the art have focused their interest upon the development of a cover coat which would not be subject to the prior art limitations.

In accordance with the present invention, this end is attained by means of a photopolymerizable resin composition which is prepared in a two-stage process. Briefly, the inventive technique involves esterifying castor oil with chlorendic anhydride to yield the chlorendic anhydride half ester and, subsequently, reacting the half ester with a reagent having acrylic functionality, a cure retardant composition and an acrylic functional monomer to yield an acrylic ester. Following the second stage of the process, conventional flame retardants and sensitizers are added to the resultant ester.

The first step in the practice of the present invention involves the esterification of castor oil with chlorendic anhydride to yield the chlorendic anhydride half ester. This end may conveniently be effected by reacting stoichiometric quantities of each material or in the alternative, be reacting an excess of anhydride ranging up to one percent beyond stoichiometry. The reaction is carried out at a temperature within the range of 120°–150° C for a time period ranging from 16–2 hours, the lower temperature corresponding with the longer reaction time and the converse. The use of an inert gas during the esterification process is advantageous from the standpoint of preventing oxidation. Similarly, the use of a catalyst to assure total reaction is desirable. Any of the conventional tertiary amine catalysts are suitable for this purpose such as N,N-benzydimethylamine, triethylamine, tripropylamine, triamylamine, amyl diethyl amine, and so forth.

Following esterification, the chlorendic anhydride half ester is reacted with a reagent having acrylic functionality, a cure retardant and an acrylic functional monomer. However, it may be advantageous to add the monomer subsequent to the second stage of the process. The product so produced is an acrylic ester which serves as the cover coat. This second stage of the reaction is effected at a temperature within the range of 70°–90° C.

Acrylic functional monomers suitable for use in the practice of the invention are selected from among acrylic and methacrylic acid derivatives evidencing low vapor pressures. Typical of such compounds are methyl acrylate, butyl acrylate, ethyl hexyl methacrylate, allyl acrylate, methyl methacrylate and the like. Monomer addition is effected in an amount renging from 5–20 parts per 100 parts of resin.

Reagents having acrylic funtionality are also added at this stage of reaction, such reagents being added for the purpose of providing ultraviolet radiation curing characteristics. Reagents found satisfactory for this purpose are glycidyl acrylate and glycidyl methacrylate, such being used in an amount sufficient to assure that at least 50 percent of the carboxyl groups are reacted therewith.

Lastly, from 50–1000 parts per million of a cure retardant are added during this stage of the reaction. Suitable agents for this purpose are paramethoxyphenol, hydroquinone and the like.

Although the esters obtained photopolymerize at satisfactory rates in the absence of a photoinitiator, their photocuring rates can be increased by addition thereto of a photoinitiator or photosensitizer subsequent to esterification. Examples of suitable photosensitizers include but are not limited to the following: acyloins, such as benzoin; acyloin derivatives such as benzoin methyl ether, benzoin ethyl ether, desyl bromide, desyl chloride, desyl amine and the like; ketones such as benzyl phenone, acetophenone, cyclopentanone, benzil, caprone, benzoyl cyclobutanone, and the like; substituted ketones such as tribromoacetophenone and trichloroacetophenone; polynuclear quinones such as benzoquinone and anthraquinone; substituted polynuclear quinones such as 1-chloroanthraquinone, 2-methylanthraquinone, and 2-3 diphenylanthraquinone. The photosensitizer may be employed in amounts ranging up to ten parts per 100 parts of resin, the specific amount being determined by practical considerations.

The final component of the novel resin is a flame retardant which may be selected from among any of the conventional retardants commonly used for this purpose. Such materials include antimony oxide, silicon oxide and the like. The amount of retardant employed may be varied depending on the desired degree of flame retardancy. Typical amounts are of the order of 40 parts per 100 parts of resin. The formulations described may be prepared in any convenient manner such as for example by blending with a high shear mixer and may be applied to the printed circuit of interest by any conventional procedure such as silk screening, grooved rod application and the like.

The rate at which the photopolymerizable composition will cure varies with the nature of the substrate, the specific ingredients in the composition, the concentration of the photosensitizer, the thickness of the applied film, the nature and intensity of the radiation source and its distance from the material. Irradiation may be effected by any one or a combination of well known methods. Thus, for example, a composition may be exposed to actinic radiation from any conventional source capable of emitting ultraviolet radiation. Suitable sources include carbon arcs, mercury vapor arcs, argon glow lamps and the like.

The time of radiation must be sufficient to provide the required dosage, irradiation being conducted at room temperature for practical purposes. Distance of the radiation source from the substrate may range from 3 inches to 40 inches.

The invention will be more readily understood by reference to the following illustrative examples which are presented solely for purposes of exposition and are not to be considered as limiting.

EXAMPLE I 185.8 grams of castor oil and 222.6 grams of chlorendic anhydride were charged into a flask together with 2.0 grams of benzyldimethylamine. The resultant mixture was heated for three hours at 130° C in a nitrogen ambient. Following, the temperature was reduced to 80° C and the nitrogen replaced by air. 90.0 grams of glycidyl methacrylate together with 0.1 grams p-methoxyphenol were slowly added. Upon completion of the addition the temperature was raised to 90° C and maintained for 4 hours. At this time 84.6 grams of 2-ethylhexylacrylate were added and the flask lowered to room temperature. Finally, 219.2 grams of a conventional antimony oxide flame retardant were added together with 21.0 grams of a benzoin ether and the mixture blended with a high shear mixer.

Next the resultant mixture was applied to an epoxy-glass substrate having deposited thereon a fine line comb pattern, the mixture being drawn down thereon by means of a blade in a thickness of approximately five mils. The film so applied was then exposed to a 200 watt per inch medium pressure mercury lamp at a distance of ten inches and a scan rate of 24 inches per minute. The composition so cured was then aged for 428 hours at 100° C and 95% relative humidity. Insulation resistance was then measured and found to be $4.6 \times 10^6$ ohms. An uncoated control substrate aged under the same conditions evidenced an insulation resistance of $2.7 \times 10^7$ ohms.

EXAMPLE II

The procedure of Example I was repeated with the exception that 202.8 grams of chlorendic anhydride and 3.9 grams of benzyldimethylamine were used in the initial reaction which was carried out for 16 hours and 66.6 grams of 2-ethylhexyl methacrylate, 51.4 grams of glycidyl methacrylate, and 23.5 grams of butyl glycidyl ether were employed in the second stage which was run for 32 hours. Insulation resistance of the resultant cured coating is comparable to that of Example I.

What is claimed is:

1. Method for the preparation of photopolymerizable acrylic resin which comprises the steps of:
   a. esterifying castor oil with chlorendic anhydride in the presence of an amine catalyst at a temperature within the range of 120°-150° C for a time period ranging from 16–2 hours, the lower temperatures corresponding with the longer reaction times and the converse, so yielding a chlorendic anhydride half ester,
   b. admixing the resultant ester with a cure retardant, from 5 to 20 parts per 100 parts of resin of an acrylic functional monomer selected from the group consisting of methyl acrylate, butyl acrylate, ethyl hexyl methacrylate, alkyl acrylate, and methyl methacrylate, and a reagent having acrylic functionality, selected from the group consisting of glycidyl acrylate, glycidyl methacrylate and a mixture of glycidyl methacrylate and butyl glycidyl ether, said reagent being employed in an amount sufficient to assure that at least 50% of the carboxyl groups present in the ester system are reacted therewith, so yielding an acrylic ester, and
   c. exposing the acrylic ester to a source of ultraviolet radiation for a time peroid sufficient to effect curing thereof.

2. Method in accordance with claim 1 wherein said amine catalyst is benzyldimethylamine.

3. Method in accordance with claim 1 where the reagent is a mixture of glycidyl methacrylate and butyl glycidyl ether.

4. Method in accordance with claim 1 wherein the monomer is 2-ethyl hexyl methacrylate.

5. Method in accordance with claim 4 wherein a photosensitizer is added to the acrylic ester.

6. Method in accordance with claim 4 wherein a flame retardant is added to the acrylic ester.

7. Method in accordance with claim 5 wherein the photosensitizer is a benzoin ether.

8. Product prepared in accordance with the method of claim 1.

* * * * *